(12) United States Patent
Konomi et al.

(10) Patent No.: US 10,276,459 B2
(45) Date of Patent: Apr. 30, 2019

(54) MEASUREMENT METHOD, MEASUREMENT PROGRAM, AND MEASUREMENT SYSTEM

(71) Applicant: Toshiba Memory Corporation, Minato-ku (JP)

(72) Inventors: Kenji Konomi, Nagoya (JP); Manabu Takakuwa, Tsu (JP)

(73) Assignee: Toshiba Memory Corporation, Minato-ku (JP)

( * ) Notice: Subject to any disclaimer, the term of this patent is extended or adjusted under 35 U.S.C. 154(b) by 0 days.

(21) Appl. No.: 15/699,430

(22) Filed: Sep. 8, 2017

(65) Prior Publication Data
US 2018/0269116 A1  Sep. 20, 2018

(30) Foreign Application Priority Data
Mar. 16, 2017  (JP) .................. 2017-051106

(51) Int. Cl.
| | |
|---|---|
| H01L 21/66 | (2006.01) |
| G01B 11/24 | (2006.01) |
| G01B 11/06 | (2006.01) |
| H01L 21/033 | (2006.01) |
| G06T 7/00 | (2017.01) |
| G02B 21/26 | (2006.01) |
| H01L 23/544 | (2006.01) |
| G02B 21/00 | (2006.01) |
| H01L 23/00 | (2006.01) |

(52) U.S. Cl.
CPC .......... H01L 22/20 (2013.01); G01B 11/0616 (2013.01); G01B 11/24 (2013.01); G02B 21/0016 (2013.01); G02B 21/26 (2013.01); G06T 7/001 (2013.01); H01L 21/0337 (2013.01); H01L 23/544 (2013.01); *G06T 2207/20021* (2013.01); *G06T 2207/30148* (2013.01); *G06T 2207/30204* (2013.01); *H01L 23/562* (2013.01); *H01L 2223/54426* (2013.01)

(58) Field of Classification Search
CPC ..... H01L 22/20; H01L 21/0337; G02B 21/26; G06T 7/001; G01B 11/0616; G01B 11/24
See application file for complete search history.

(56) References Cited

U.S. PATENT DOCUMENTS 6,238,851 B1  5/2001  Nishi

FOREIGN PATENT DOCUMENTS

| | | |
|---|---|---|
| JP | 10-229039 | 8/1998 |
| JP | 2007-227614 | 9/2007 |
| JP | 4792833 | 10/2011 |
| JP | 2012-234901 | 11/2012 |

*Primary Examiner* — John P. Dulka
(74) *Attorney, Agent, or Firm* — Oblon, McClelland, Maier & Neustadt LLP

(57) ABSTRACT

According to one embodiment, there is provided a measurement method. The method includes acquiring layer information related to a plurality of layers to be superimposed for each of a plurality of shot regions on a substrate. The method includes dividing the plurality of shot regions into a plurality of groups corresponding to a layer attribute based on the acquired layer information. The method includes deciding a measurement condition of a measuring apparatus for each of the plurality of groups. The plurality of layers are sequentially stacked on the substrate to manufacture a semiconductor device.

17 Claims, 12 Drawing Sheets

| SHOT REGION IDENTIFIER | LAYER IDENTIFIER | FILM THICKNESS |
|---|---|---|
| SH-1 | L1 | D11 |
| SH-1 | L2 | D12 |
| SH-2 | L1 | D21 |
| SH-2 | L2 | D22 |
| ⋮ | ⋮ | ⋮ |
| SH-k | L1 | Dk1 |
| SH-k | L2 | Dk2 |
| ⋮ | ⋮ | ⋮ |
| SH-n | L1 | Dn1 |
| SH-n | L2 | Dn2 |

<STRUCTURE A>

<STRUCTURE B>

| SHOT REGION IDENTIFIER | LAYER IDENTIFIER |
|---|---|
| SH-1 | GROUP A |
| SH-2 | GROUP A |
| ⋮ | ⋮ |
| SH-k | GROUP E |
| SH-(k+1) | GROUP E |
| ⋮ | ⋮ |
| SH-(n-1) | GROUP A |
| SH-n | GROUP A |

132 (OR 135)

| GROUP IDENTIFIER | WAVELENGTH FILTER SETTING VALUE | FOCUS SETTING VALUE | TEMPLATE IMAGE IDENTIFIER |
|---|---|---|---|
| GROUP A | FILTER A | Focus A | TEMPLATE A |
| GROUP B | FILTER B | Focus B | TEMPLATE B |
| GROUP C | FILTER C | Focus C | TEMPLATE C |
| GROUP D | FILTER D | Focus D | TEMPLATE D |
| GROUP E | FILTER E | Focus E | TEMPLATE E |

MEASUREMENT METHOD, MEASUREMENT PROGRAM, AND MEASUREMENT SYSTEM

CROSS-REFERENCE TO RELATED APPLICATIONS

This application is based upon and claims the benefit of priority front Japanese Patent Application No. 2017-051106, filed on Mar. 16, 2017; the entire contents of which are incorporated herein by reference.

FIELD

Embodiments described herein relate generally to a measurement method, a measurement program, and a measurement system.

BACKGROUND

In manufacturing of semiconductor devices, a plurality of layers are formed over a plurality of shot regions on a substrate. At this time, it is desirable to appropriately perform measurement for each shot region.

DETAILED DESCRIPTION

Figure 1:
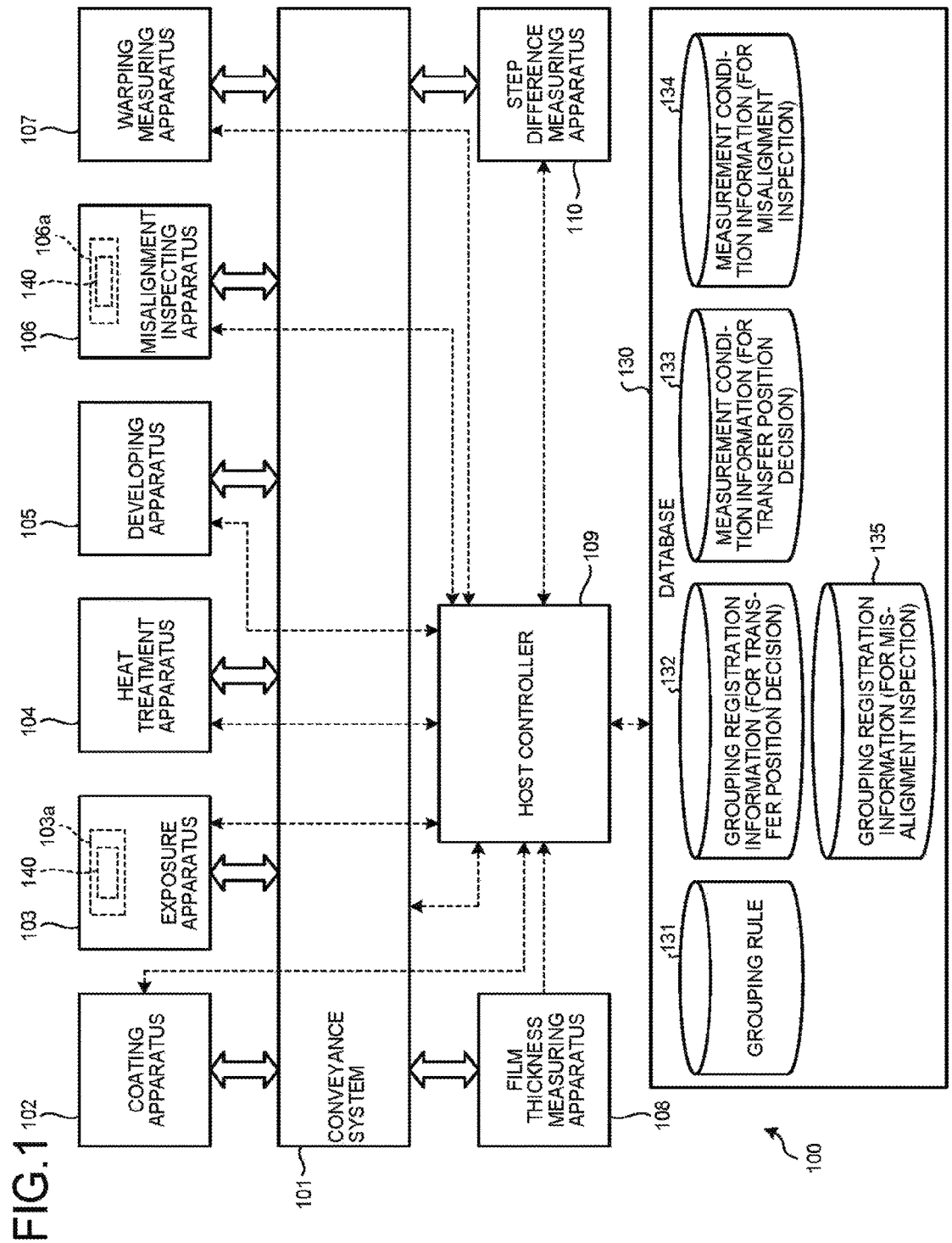
FIG. 1 is a diagram illustrating a configuration of a measurement system according to an embodiment.

In general, according to one embodiment, there is provided a measurement method. The method includes acquiring layer information related to a plurality of layers to be superimposed for each of a plurality of shot regions on a substrate. The method includes dividing the plurality of shot regions into a plurality of groups corresponding to a layer attribute based on the acquired layer information. The method includes deciding a measurement condition of a measuring apparatus for each of the plurality of groups. The plurality of layers are sequentially stacked on the substrate to manufacture a semiconductor device.

Exemplary embodiments of a measurement system will be explained below in detail with reference to the accompanying drawings. The present invention is not limited to the following embodiments.

(Embodiment)

A measurement method according to an embodiment is executed in a manufacturing process for a semiconductor device. In the manufacturing process for the semiconductor device, a plurality of layers are stacked above a substrate (for example, a semiconductor substrate). A device pattern and an overlay mark are formed on each layer for each shot region. As the device patterns of the respective layers are stacked, a semiconductor circuit or the like is formed on the substrate. In an exposure process for the semiconductor device, a reference position for a transfer position is measured using an overlay mark of a lower layer in order to decide a pattern transfer position to an upper layer on which no pattern is formed. In an inspection process for the semiconductor device, a misalignment amount between the upper layer and the lower layer is measured by using the overlay marks of the upper layer and the lower layer in order to inspect whether the upper layer and the lower layer on which the pattern is formed are properly superimposed.

In the manufacturing of the semiconductor device, a degree of difficulty of miniaturization of a semiconductor integrated circuit is increasing, and a miniaturization pace is slowing down. For memory semiconductors, in order to increase a storage capacity with no miniaturization, so-called 3D memories in which storage elements have a stacked structure, and a storage capacity is increased by increasing the number of stacks have been developed.

One of problems in 3D memory manufacturing is that a substrate suffers warping/deformation/step difference when storage elements are highly stacked. In this case, when the overlay mark is optically measured in the exposure process for the semiconductor device or the inspection process for the semiconductor device, an appearance of the overlay mark ((brightness, sharpness, contrast, a color, or the like) may be different depending on a position on the substrate, and an error in which the overlay mark is unable to be measured may occur. If the error in which the overlay mark is unable to be measured occurs, sequence of process steps for the substrate is stopped.

In this regard, in the present embodiment, for measurement of the overlay mark, a plurality of shot regions on a substrate are classified into a plurality of groups corresponding to an attribute of a layer based on information of warping/deformation/step difference of the substrate or the like, and a measurement condition corresponding to an attribute is decided for each group, and thus the occurrence of the error in which the overlay mark is unable to be measured is prevented.

In other words, the present embodiment proposes a technique of feeding forward at least information of the lower layer in advance. In a process of forming a 3D device structure, warping of a substrate occurs due to stress of a formed film, a step difference occurs due to a device structure, and a variation in a film thickness of a formed film occurs in a subsequent process accordingly. As a result, in the exposure process for the semiconductor device or the inspection process for the semiconductor device, the appearance of the overlay mark in a substrate plane may differ, and the error in which the overlay mark is unable to be measured may occur. For this reason, a measurement system that measure the step difference, the warping, and the film thickness of the substrate in advance, classifies measurement shots into groups using measurement results, and appropriately setting a measurement condition for each group, thereby preventing the occurrence of the error in which the overlay mark is unable to be measured is proposed.

Specifically, measurement for transfer position decision or measurement for misalignment inspection is performed using a measurement system 100 illustrated in FIG. 1. FIG. 1 is a block diagram illustrating a hardware configuration of the measurement system 100.

The measurement system 100 includes a conveyance system 101, a coating apparatus 102, an exposure apparatus 103, a heat sequence of process steps apparatus 104, a developing apparatus 105, a misalignment inspecting apparatus 106, a warping measuring apparatus 107, a film thickness measuring apparatus 108, a host controller 109, a step difference measuring apparatus 110, and a database 130. The coating apparatus 102, the exposure apparatus 103, the heat sequence of process steps apparatus 104, the developing apparatus 105, the misalignment inspecting apparatus 106, the warping measuring apparatus 107, the film thickness measuring apparatus 108, and the step difference measuring apparatus 110 are configured to be able to convey the substrate to the next apparatus through the conveyance system 101.

The host controller 109 is connected to be able to perform communication with the conveyance system 101, the coating apparatus 102, the exposure apparatus 103, the heat sequence of process steps apparatus 104, the developing apparatus 105, the misalignment inspecting apparatus 106, the warping measuring apparatus 107, the film thickness measuring apparatus 108, the step difference measuring apparatus 110, and the database 130 via a communication line (not illustrated). The host controller 109 is able to control each of the conveyance system 101, the coating apparatus 102, the exposure apparatus 103, the heat sequence of process steps apparatus 104, the developing apparatus 105, the misalignment inspecting apparatus 106, the warping measuring apparatus 107, the film thickness measuring apparatus 108, and the step difference measuring apparatus 110 and refer to the database 130.

The exposure apparatus 103 includes a measuring apparatus 103a. The measuring apparatus 103a measures a pattern transfer position to the upper layer on which no pattern is formed. The misalignment inspecting apparatus 106 includes a measuring apparatus 106a. The measuring apparatus 106a performs measurement for inspecting whether the upper layer and the lower layers on which the pattern is formed are properly superimposed.

Figure 2:
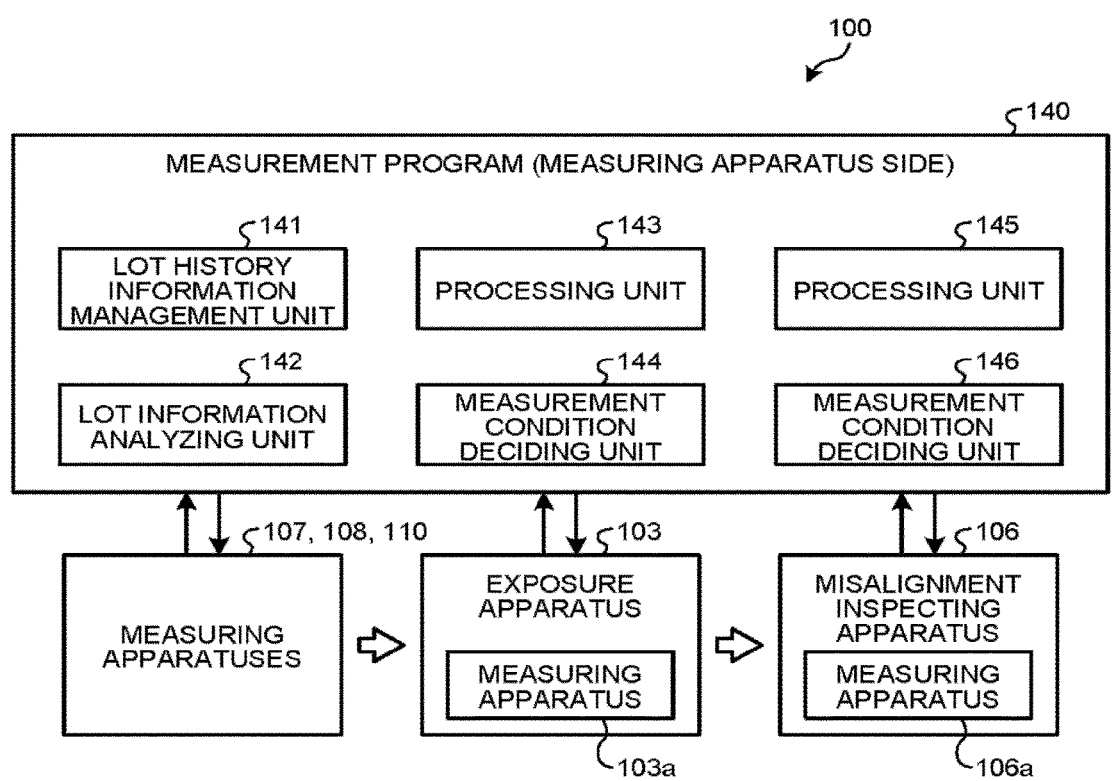
FIG. 2 is a diagram illustrating a configuration of a measurement program according to an embodiment.

Next, a functional configuration of a measurement program 140 will be described with reference to FIG. 2. FIG. 2 is a diagram illustrating the functional configuration of the measurement program 140.

The measurement program 140 is installed in each of the measuring apparatus 103a and the measuring apparatus 106a. The measurement program 140 may be installed in each of the measuring apparatus 103a and the measuring apparatus 106a in a form of hardware (for example, as a circuit) or in a form of software (for example, as a functional module which is stored in a memory (not illustrated) and read collectively or sequentially with the progress of the process), some functions of the measurement program 140 may be installed in a form of hardware, and the remaining functions of the measurement program 140 may be installed in a form of software.

The measurement program 140 has a lot history information management unit 141, a lot information analyzing unit 142, a processing unit 143, a measurement condition deciding unit 144, a processing unit 145, and a measurement condition deciding unit 146.

The lot history information management unit 141 manages layer information for every two or more shot regions on the substrate for each substrate in a lot including a plurality of substrates. The lot refers to a set of a plurality of substrates conveyed by the conveyance system 101 and serves as a substrate management unit. The layer information is information including a measurement results related to a plurality of layers to be superimposed.

For example, the lot history information management unit 141 is able to acquire a result of measuring the step difference from the step difference measuring apparatus 110 as the layer information. The lot history information management unit 141 is able to acquire a result of measuring warping from the warping measuring apparatus 107 as the layer information. The lot history information management unit 141 is able to acquire a result of measuring a film thickness from the film thickness measuring apparatus 100 as the layer information.

The lot information analyzing unit 142 obtains the layer information for each of substrates in a lot including a plurality of substrates in accordance with a surface step difference of the substrate, a warping shape of the substrate, and a thickness of a film formed on the substrate. The layer information is information including at least one of a layer height, a layer film thickness, and a layer structure. The lot information analyzing unit 142 supplies the layer information to the processing units 143 and 145.

The processing unit 143 performs a process of grouping a plurality of shot regions on the substrate for the measurement for the transfer position decision. In other words, the processing unit 143 divides a plurality of shot regions on the substrate into a plurality of groups corresponding to the layer attribute based on the layer information for each of substrates in a lot including a plurality of substrates. The processing unit 143 accesses the database 130 via a communication line and the host controller 109 and refers to a grouping rule 131. The grouping rule 131 is decided in advance so that short regions having close layer attributes (for example, close layer heights, close layer film thicknesses, and close layer structure) are associated with the same group. In other words, a plurality of groups can be regarded as labels of respective sections when the layer attribute is divided into a plurality of sections.

The processing unit 143 divides a plurality of shot regions on the substrate into a plurality of groups corresponding to the layer attribute based on the layer information and the grouping rule 131. The processing unit 143 generates grouping registration information 132 for the transfer position decision in accordance with a grouping result. The grouping registration information 132 is information in which information identifying a shot region and information identifying a group are associated with each other for a plurality of shot regions on the substrate. The processing unit 143 stores the grouping registration information 132 in the database 130 via the communication line and the host controller 109 to be associated with a lot identifier and a substrate identifier.

The measurement condition deciding unit 144 decides a measurement condition of each group on the substrate for the measurement for the transfer position decision. In other words, the measurement condition deciding unit 144 acquires the grouping registration information 132 for the transfer position decision from the processing unit 143 or from the database 130 via the communication line and the host controller 109. The measurement condition deciding unit 144 decides the measurement condition for each of a plurality of groups included in the grouping registration information 132. The measurement condition deciding unit 144 is able to decide a predetermined default measurement condition for each group at an initial state. The default measurement condition is a measurement condition which is experimentally decided in advance using a prototype substrate. The measurement condition deciding unit 144 supplies the decided measurement condition to the measuring apparatus 103a of the exposure apparatus 103 (see FIG. 3) as measurement condition information 133. The measurement condition deciding unit 144 stores the measurement condition information 133 for the transfer position decision in the database 130 via the communication line and the host controller 109 to be associated with the lot identifier and the substrate identifier (see FIG. 1).

The substrates in the lot may undergo the exposure process at close timings. The substrates in the lot are likely to have close layer attributes. For this reason, the measurement condition deciding unit 144 is able to feed back the measurement result actually obtained by the measuring apparatus 103a for one substrate in the lot and change the measurement condition to be used for the measurement of the overlay mark of the substrate from the default measurement condition to a more appropriate measurement condition. The measurement condition deciding unit 144 supplies the changed measurement condition to the measuring apparatus 103a of the exposure apparatus 103 as the measurement condition information 133 (see FIG. 3). Further, the measurement condition deciding unit 144 stores the measurement condition information 133 for the transfer position decision in the database 130 via the communication line and the host controller 109 to be associated with the lot identifier and the substrate identifier (see FIG. 1).

The processing unit 145 performs a process of grouping a plurality of shot regions on the substrate for the measurement for the misalignment inspection. In other words, the processing unit 145 divides a plurality of shot regions on the substrate into a plurality of groups corresponding to the layer attribute based on the layer information for each of substrates in a lot including a plurality of substrates. The processing unit 145 accesses the database 130 via the communication line and the host controller 109 and refers to the grouping rule 131. The grouping rule 131 is decided in advance so that short regions having close layer attributes (for example, close layer heights, close layer film thicknesses, and close layer structure) are associated with the same group. In other words, a plurality of groups can be regarded as labels of respective sections when the layer attribute is divided into a plurality of sections.

The processing unit 145 divides a plurality of shot regions on the substrate into a plurality of groups corresponding to the layer attribute based on the layer information and the grouping rule 131. The processing unit 145 generates grouping registration information 135 for misalignment position inspection in accordance with a grouping result. The grouping registration information 135 is information in which information identifying a shot region and information identifying a group are associated with each other for a plurality of shot regions on the substrate. The processing unit 145 stores the grouping registration information 135 in the database 130 via the communication line and the host controller 109.

The measurement condition deciding unit 146 decides a measurement condition of each group on the substrate for the measurement for the misalignment inspection. In other words, the measurement condition deciding unit 146 acquires the grouping registration information 135 for the misalignment inspection from the processing unit 145 or from the database 130 via the communication line and the host controller 109. The measurement condition deciding unit 146 decides the measurement condition for each of a plurality of groups included in the grouping registration information 135. The measurement condition deciding unit 146 is able to decide a predetermined default measurement condition for each group at an initial state. The default measurement condition is a measurement condition which is experimentally decided in advance using a prototype substrate. The measurement condition deciding unit 144 supplies the decided measurement condition to the measuring apparatus 106a of the misalignment inspecting apparatus 106 as measurement condition information 134 (see FIG. 3). The measurement condition deciding unit 144 stores the measurement condition information 134 for the misalignment inspection in the database 130 via the communication line and the host controller 109 to be associated with the lot identifier and the substrate identifier (see FIG. 1).

The substrates in the lot may undergo the misalignment inspection at consecutive timings. The substrates in the lot are likely to have close layer attributes. For this reason, the measurement condition deciding unit 146 is able to feed back the measurement results actually obtained by the measuring apparatuses 103a and 106a for one substrate in the lot and change the measurement condition to be used for the measurement of the overlay mark of the substrate from the default measurement condition to a more appropriate measurement condition. The measurement condition deciding unit 144 supplies the changed measurement condition to the measuring apparatus 106a of the misalignment inspecting apparatus 106 as the measurement condition information 133 (see FIG. 3). Further, the measurement condition deciding unit 144 stores the measurement condition information 134 for the misalignment inspection in the database 130 via the communication line and the host controller 109 to be associated with the low identifier and the substrate identifier (see FIG. 1).

Figure 3:
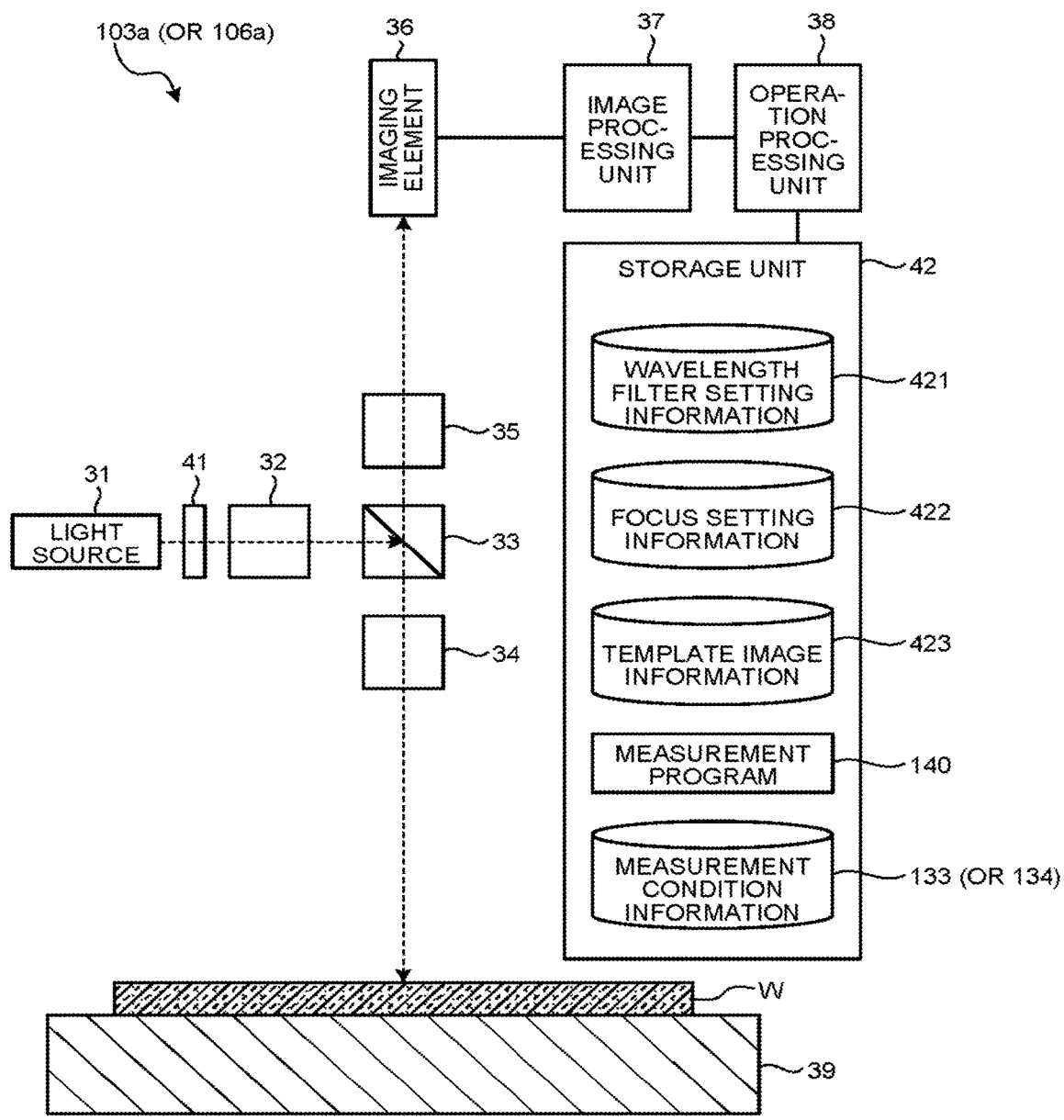
FIG. 3 is a diagram illustrating a configuration of a measuring apparatus according to an embodiment.

Next, a configuration of the measuring apparatus 103a will be described with reference to FIG. 3. FIG. 3 is a diagram illustrating the configuration of the measuring apparatus 103a.

The measuring apparatus 103a includes a light source 31, a wavelength filter 41, an illumination lens 32, a half mirror 33, an objective lens 34, an imaging lens 35, an imaging element 36, an image processing unit 32, an operation processing unit 38, a storage unit 42, and a stage 39. The storage unit 42 stores wavelength filter setting information 421, focus setting information 422, template image information 423, the measurement condition information 133, and the measurement program 140.

The wavelength filter setting information 421 includes information related to setting values of a plurality of filters included in the wavelength filter 41. For example, the setting values of a plurality of filters include a filter A, a filter B, a filter C, a filter D, and a filter F.

The focus setting information 422 includes information related to a plurality of focus setting values of the measuring apparatus 103a. A plurality of focus setting values correspond to a plurality of height positions to control the stage 39, and include, for example, a focus A, a focus B, a focus C, a focus B, and a focus E.

The template image information 423 includes information related to a plurality of template images to be used for template matching of the overlay mark in an image. For example, identifiers of a plurality of template images include a template A, a template B, a template C, a template D, and a template E.

The measurement condition information 133 is information indicating the measurement condition decided in accordance with the measurement program 140 and serves as information indicating the measurement condition for the transfer position decision. The measurement condition information 133 is information in which information identifying a group and information identifying a setting value of the wavelength filter, a focus setting value, and a template image are associated with a plurality of groups (see FIG. 12).

The light source 31 generates illumination light which illuminates substrate W. A wavelength of the illumination light may be set to a visible region or an infrared region. The wavelength filter 41 includes a plurality of filters and is configured such that a selected filter among a plurality of filters is insertable into a light path from the light source 31 to the substrate W. A plurality of filters are configured to selectively transmit light of different wavelength bands. For example, the wavelength filter 41 inserts a filter selected in accordance with the measurement condition information 133 into the light path from the light source 31 to the substrate W.

The illumination lens 3 collects the illumination light which has been emitted from the light source 31 and passed through the wavelength filter 41. The half mirror 33 reflects the illumination light emitted from the substrate W and transmits reflected light reflected from the substrate W. The objective lens 34 focuses the illumination light on the substrate W. A height position of the stage 39 on which the substrate W is placed is able to be controlled through a driving mechanism (not illustrated) and is able to be controlled to a height position corresponding to the focus setting value selected in accordance with the measurement condition information 133.

The imaging lens 35 focuses the illumination light on an imaging plane of the imaging element 36. The imaging element 36 images the overlay mark on the substrate W. The imaging element 36 may be a CCD or CMOS image sensor. The image processing unit 37 performs image processing on a captured image captured by the imaging element 36. The operation processing unit 38 performs template matching using the captured image captured by the imaging element 36 and a selected template image among a plurality of template images and performs image recognition on the overlay mark in the captured image. For example, the operation processing unit performs the template matching using the captured image and the template image selected in accordance with the measurement condition information 133 and performs the image recognition on the overlay mark in the captured image. When the image recognition on the overlay mark is successfully performed, the operation processing unit 38 calculates a misalignment amount of the overlay mark based on the recognized image.

It should be noted that FIG. 3 has been described in connection with the example in which the wavelength filter 41 is able to insert a filter between the light source 31 and the illumination lens 32, but a position at which the wavelength filter 41 is able to insert a filter may be another position as long as the position is in the light path from the light source 31 to the substrate W.

Further, the configuration of the measuring apparatus 106a is basically similar to that of the measuring apparatus 103a except that the measurement condition information 133 for the transfer position decision is replaced with the measurement condition information 134 for the misalignment inspection.

Figure 4:
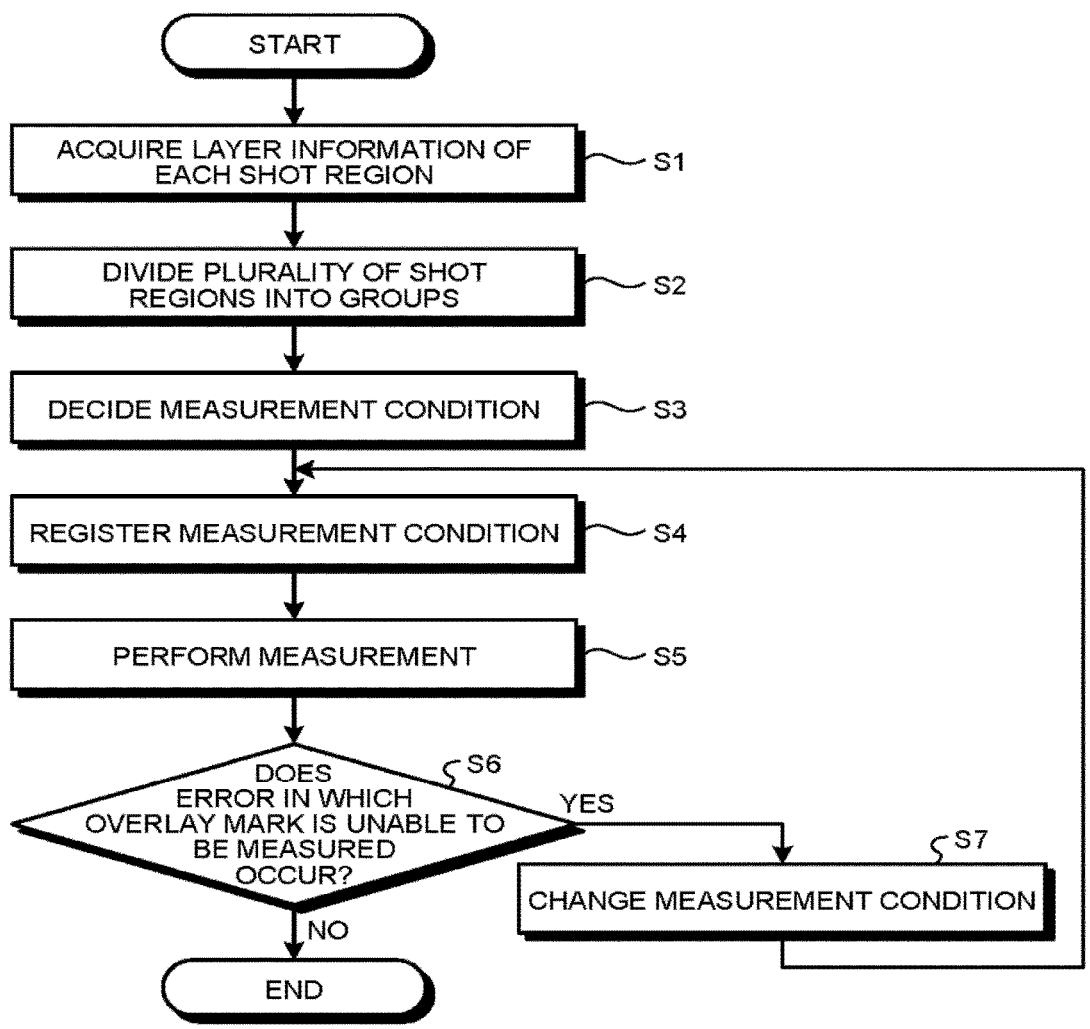
FIG. 4 is a flowchart illustrating an operation (measurement method) of a measurement system according to an embodiment.

Next, an operation of the measurement system 100 will be described with reference to FIG. 4. FIG. 4 is a flowchart illustrating the operation of the measurement system 100.

The measurement system 100 selects a substrate (substrate of interest) from a plurality of substrates in a lot. The measurement system 100 acquires the layer information of each shot region on the substrate for the substrate of interest (S1).

Figure 5:
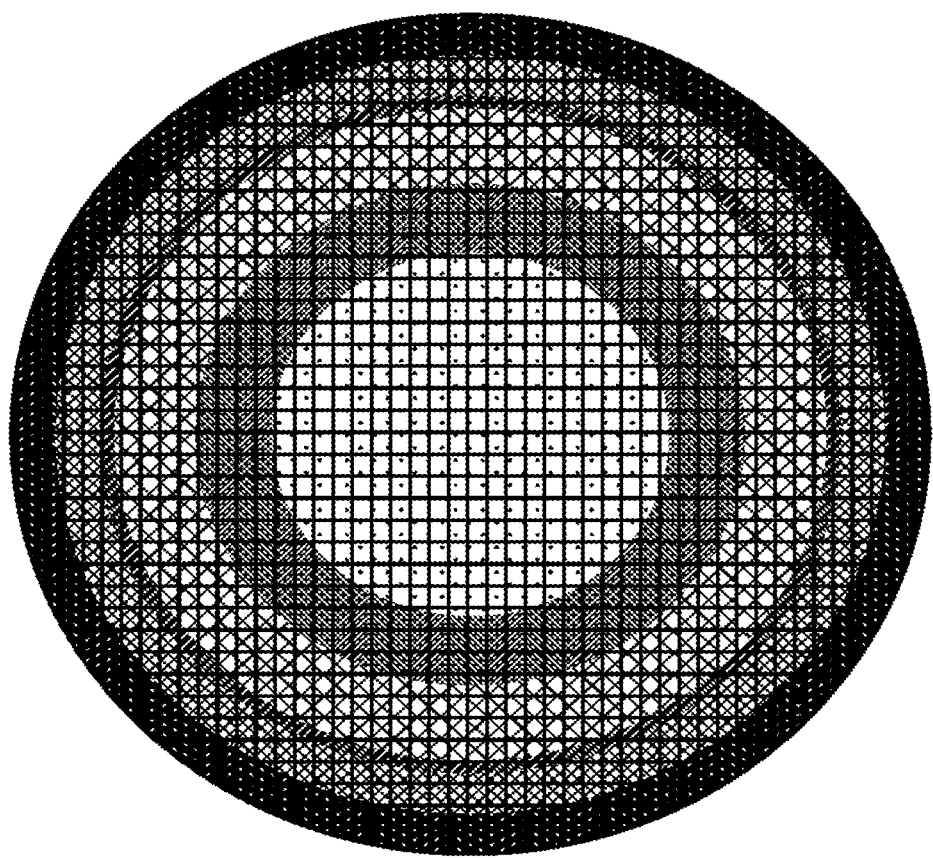
FIG. 5 is a diagram illustrating a result of measuring a step difference according to an embodiment.

For example, the measurement system 100 is able to acquire a result of measuring the step difference from the step difference measuring apparatus 110 as the layer information. For example, the step difference measuring apparatus 110 is a macro inspecting apparatus and generates an auto macro inspection (AMI) image of the substrate as a result of measuring the step difference. The AMI image is an image obtained by imaging the entire substrate, and the step difference on the substrate is indicated such that brightness is changed depending on the step difference on the substrate as illustrated in FIG. 5. FIG. 5 is a diagram illustrating a result of measuring the step difference.

Alternatively, for example, the step difference measuring apparatus 110 is an atomic force microscope (AFM) and generates an AFM image of the substrate as the result of measuring the step difference. In the ATM image, the step difference on the substrate is indicated by three-dimensionally illustrating a surface shape of the substrate.

Figure 6:
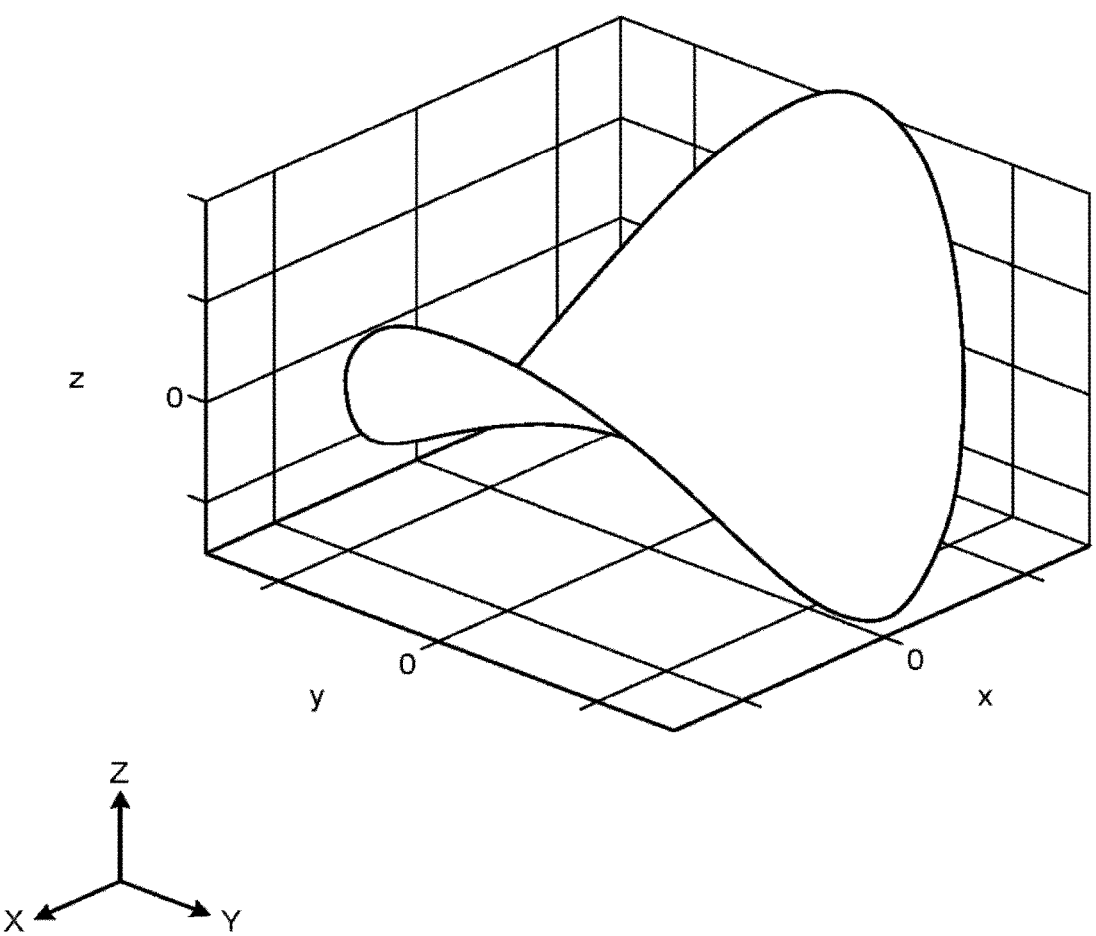
FIG. 6 is a diagram illustrating a result of measuring warping of a substrate according to an embodiment.

The measurement system 100 is able to acquire a result of measuring warping from the warping measuring apparatus 107 as the layer information. For example, the warping measuring apparatus 107 includes a laser displacement meter and is able to measure the warping by detecting displacement of a plurality of points on the surface of the substrate through a laser displacement meter. A result of measuring a warping amount distribution is 3D information as illustrated in FIG. 6. FIG. 6 is a diagram illustrating a result of measuring the warping of the substrate.

Figures 7, 8:
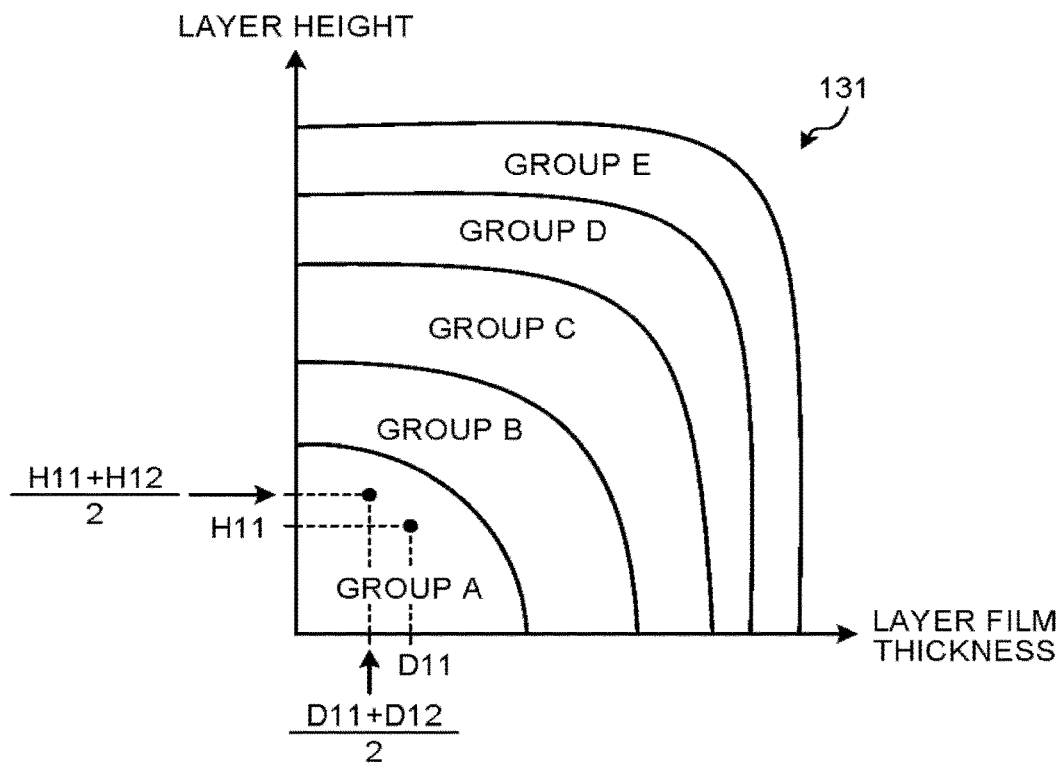
FIG. 7 is a diagram illustrating a result of measuring a film thickness according to an embodiment.
FIG. 8 is a diagram illustrating a grouping rule according to an embodiment.

The measurement system 100 is able to acquire a result of measuring a film thickness from the film thickness measuring apparatus 108 as the layer information. For example, the film thickness measuring apparatus 108 is an optical film thickness measuring apparatus such as an ellipsometer and generates a film thickness measured by an optical method such as an ellipsometric method as the measurement result. The result of measuring the film thickness may include film thicknesses of layers L1 and L3 to be superimposed for each shot region. A result of measuring the film thickness is information in which information (shot region identifier) identifying a shot region, information (layer identifier) identifying a layer, and a measured value of a film thickness are associated with one another as illustrated in FIG. 7. FIG. 7 is a diagram illustrating a result of measuring the film thickness.

The measurement system 100 obtains the layer information for the substrate of interest in accordance with a surface step difference of the substrate, a warping shape of the substrate, and a thickness of a film formed on the substrate. The layer information is information including at least one of a layer height, a layer film thickness, and a layer structure.

The measurement system 100 divides a plurality of shot regions into a plurality of groups corresponding to the layer attribute (at least one of the layer height, the layer film thickness, and the layer structure) based on the layer information acquired in S1 (S2).

Figures 9, 10:
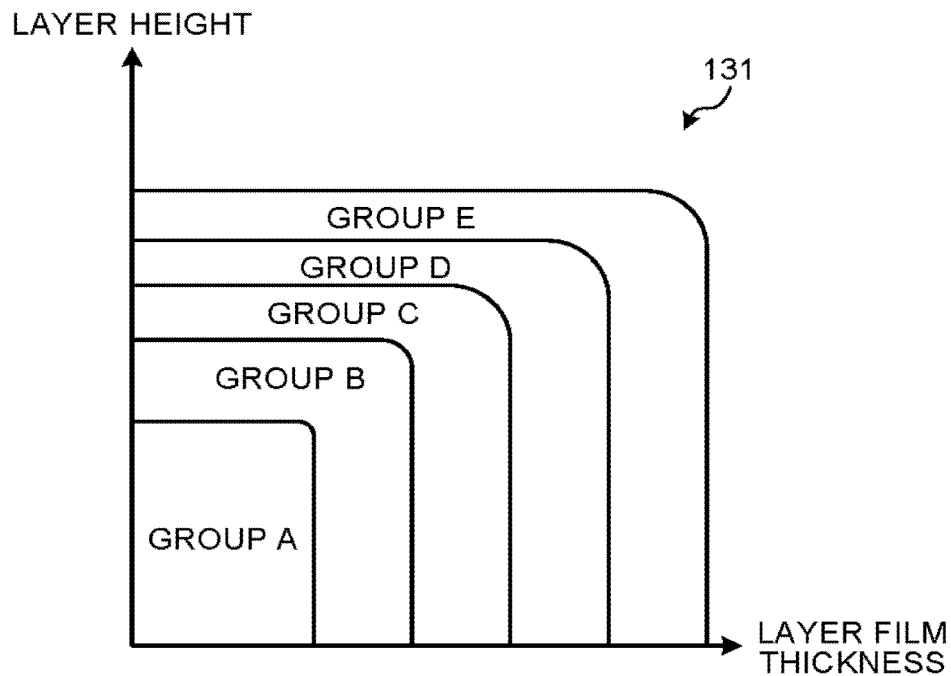
FIG. 9 is a diagram illustrating a grouping rule according to an embodiment.
FIG. 10 is a diagram illustrating grouping registration information according to an embodiment.

The measurement system 100 refers to the grouping rule 131 and divides a plurality of shot regions on the substrate into a plurality of groups corresponding to the layer attribute in accordance with the grouping rule 131 from the layer information. The grouping rule 131 is decided in advance so that short regions having close layer attributes (for example, close layer heights, close layer film thicknesses, and close layer structure) are associated with the same group. In other words, a plurality of groups can be regarded as labels of respective sections when the layer attribute is divided into a plurality of sections. The grouping rule 131 may include information in which groups A to E are mapped for each consecutive region on a plane having the layer film thickness and the layer height as two axes for a structure A as illustrated in FIG. 8. The grouping rule 131 may include information in which groups A to E are mapped for each consecutive region on a plane having the layer film thickness and the layer height as two axes for a structure B as illustrated in FIG. 9. FIGS. 8 and 9 are diagrams illustrating the grouping rule 131.

Figures 11, 12:
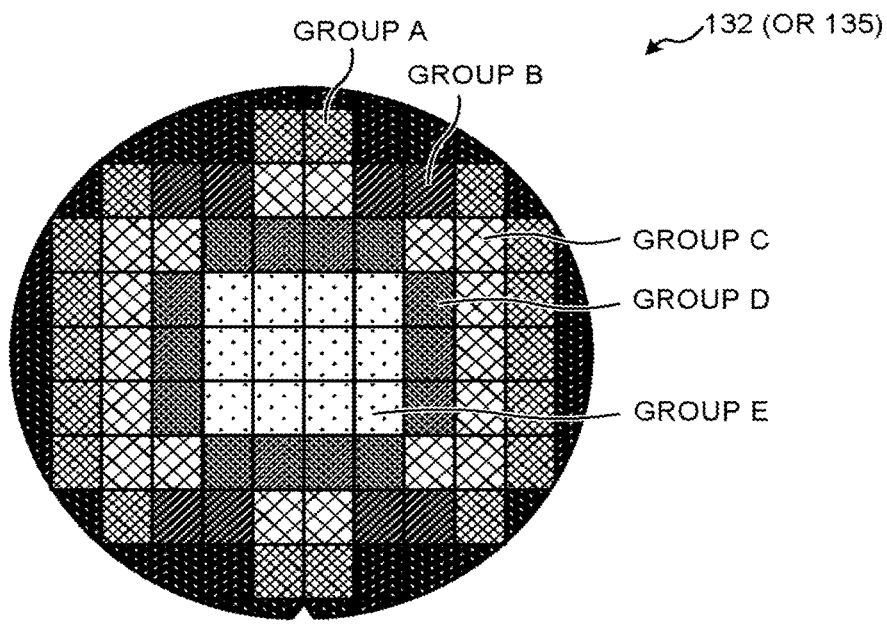
FIG. 11 is a diagram illustrating grouping registration information according to an embodiment.
FIG. 12 is a diagram illustrating measurement condition information according to an embodiment.

For example, it is desirable to consider information of the layer L1 as the measurement condition for the transfer position decision. In the grouping rule 131 illustrated in FIG. 8, when a layer L1 of a shot region SH-1 has the structure A, the film thickness of the layer L1 is D11, and the height of the layer L1 is H11, a coordinate point (D11, H11) exists within a region of the group A. Accordingly, the shot region SH-1 is assigned to the group A in accordance with the grouping rule 131 illustrated in FIG. 8. The other shot regions are also similarly assigned to groups, and for example, the grouping registration information 132 for the transfer position decision as illustrated in FIG. 10 is obtained. FIG. 10 is a diagram illustrating the grouping registration information. Alternatively, the grouping registration information may be configured as a shot map, and for example, the grouping registration information 132 for the transfer position decision as illustrated in FIG. 11 is obtained. FIG. 11 is a diagram illustrating the grouping registration information.

For example, it is desirable to consider information obtained by averaging information of the layers L1 and L2 as the measurement condition for the misalignment inspection. In the grouping rule 131 illustrated in FIG. 8, when both the layers L1 and L2 of the shot region SH-1 have the structure A, the film thicknesses of the layers L1 and L2 is D11 and D12 respectively, and heights of the layers L1 and L2 are H11 and H12 respectively, a coordinate point ((D11+D12)/2, (H11+H12)/2) exist in a region of the group A. Accordingly, the shot region SH-1 is assigned to the group A in accordance with the grouping rule 131 illustrated in FIG. 8. The other shot regions are also similarly assigned to groups, and for example, the grouping registration information 135 for the misalignment inspection illustrated in FIG. 10 is obtained. Alternatively, grouping registration information may be configured as a shot map, and for example, the grouping registration information 135 for the misalignment inspection illustrated in FIG. 11 is obtained.

The measurement system 100 decides the measurement condition of each group on the substrate (S3).

For example, the measurement system 100 acquires the grouping registration information 132 for the transfer position decision. The measurement condition deciding unit 144 decides the measurement condition for each of a plurality of groups included in the grouping registration information 132. For example, the measurement system 100 is able to decide a predetermined default measurement condition for each group. The default measurement condition is a measurement condition which is experimentally decided in advance using a prototype substrate.

In other words, for example, the measurement system 100 acquires the grouping registration information 135 for the misalignment inspection. The measurement condition deciding unit 146 decides the measurement condition for each of a plurality of groups included in the grouping registration information 135. The measurement system 100 is able to decide a predetermined default measurement condition for each group at an initial state. The default measurement condition is a measurement condition which is experimentally decided in advance using a prototype substrate.

The measurement system 100 registers the measurement condition decided in S3 in the measuring apparatus (S4).

For example, the measurement system 100 generates the measurement condition decided in S3 as the measurement condition information 133 for the transfer position decision. For example, the measurement condition information 133 is information in which information (group identifier) identifying a group and information (template image identifier) identifying a setting value of the wavelength filter, a focus setting value, and a template image are associated with a plurality of groups as illustrated in FIG. 12. The measurement system 100 supplies the measurement condition information 133 for the transfer position decision to the measuring apparatus 103a of the exposure apparatus 103 (see FIG. 3). Further, the measurement condition deciding unit 144 stores the measurement condition information 133 for the trans position decision in the database 130 via the communication line and the host controller 109 to be associated with the lot identifier and the substrate identifier (see FIG. 1).

For example, the measurement system 100 generates the measurement condition decided in S3 as the measurement condition information 134 for the misalignment inspection. For example, the measurement condition information 134 is information in which information (group identifier) identifying a group and information (template image identifier) identifying a setting value of the wavelength filter, a focus setting value, and a template image are associated with a plurality of groups as illustrated in FIG. 12. The measurement system 100 supplies the measurement condition information 134 for the misalignment inspection to the measuring apparatus 106a of the misalignment inspecting apparatus 106 (see FIG. 3). Further, the measurement condition deciding unit 144 stores the measurement condition information 134 for the misalignment inspection in the database 130 via the communication line and the host controller 109 to be associated with the lot identifier and the substrate identifier (see FIG. 1).

The measurement system 100 causes the measuring apparatus to perform measurement (S5).

Figure 13A:
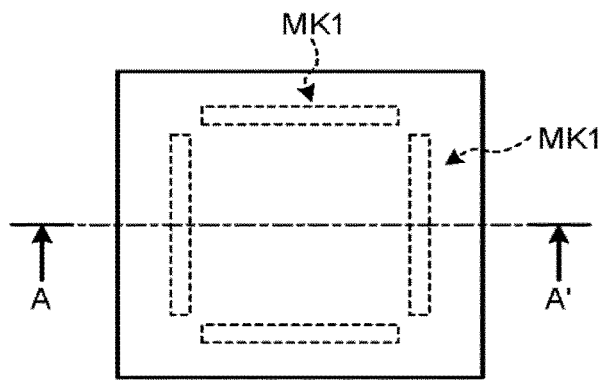
FIGS. 13A to 13O are diagrams illustrating a measurement target of a measuring apparatus according to an embodiment.
Figure 13B:
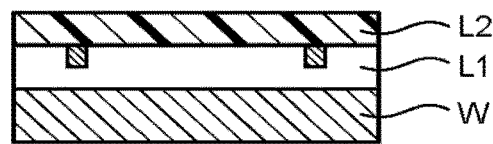

For example, the measuring apparatus 103a of the exposure apparatus 103 performs measurement for deciding the pattern trans position to the upper layer on whist no pattern is for using the overlay mark of the lower layer in the substrate in accordance with the measurement condition information 133 for the transfer position decision. For example, as illustrated in FIGS. 13A and 13E, the measuring apparatus 103a measures an overlay mark MK1 in a state in which a layer L1 including the overlay mark MK1 is formed on the substrate W, and a layer L2 on which no pattern is formed is formed on the layer L1. FIGS. 13A and 13B are diagrams illustrating a measurement target of the measuring apparatus 103a. FIG. 13E is a view illustrating a cross section taken along line A-A' of FIG. 13A. In other words, the measuring apparatus 103a controls the measurement condition in accordance with the measurement condition information 133 for the transfer position decision, images the overlay mark MK1, and performs template matching on the captured image and the template image.

Figure 13C:
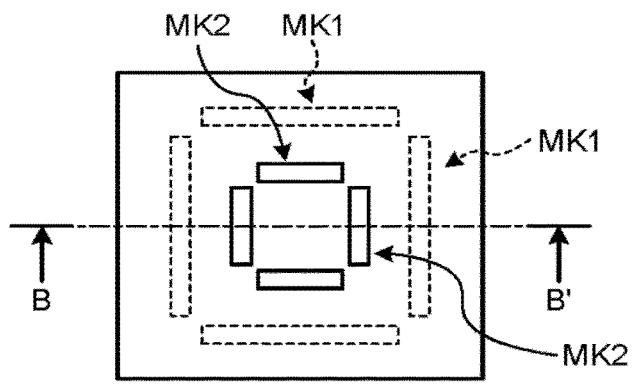
Figure 13D:
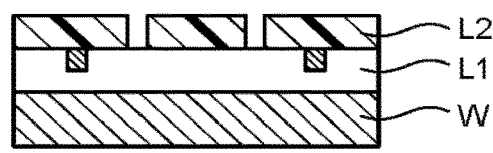

For example, the measuring apparatus 106a of the misalignment inspecting apparatus 106 measures the misalignment amount between the upper layer and the lower layer using the overlay marks of the upper layer and the lower layer in the substrate in accordance with the measurement condition information 134 for the misalignment inspection. For example, as illustrated in FIGS. 13C and 13D, the measuring apparatus 106a measures overlay marks MK1 and MK2 in a state where a layer L1 including the overlay mark MK1 is formed on the substrate W, and a layer L2 including the overlay mark MK2 is formed on the layer L1. FIGS. 13C and 13D are diagrams illustrating the measurement target of the measuring apparatus 106a. FIG. 13D is a view illustrating a cross section taken along line B-B' of FIG. 13C. In other words, the measuring apparatus 106a controls the measurement condition in accordance with the measurement condition information 134 for the misalignment inspection, images the overlay marks MK1 and MK2, and performs template matching on the captured image and the template image.

The measurement system 100 determines whether or not the error in which the overlay mark is unable to be measured occurs in the measuring apparatus (S6).

For example, when the error in which the overlay mark is unable to be measured by the measuring apparatus 103a of the exposure apparatus 103 occurs (Yes in S6), part or all of the measurement condition in the measurement condition information 133 is changed (S7), and the process returns to S4.

For example, when the error in which the overlay mark is unable to be measured by the measuring apparatus 106a in the misalignment inspecting apparatus 106 occurs (Yes in S6), part or all of the measurement condition in the measurement condition information 134 is changed (S7), and the process returns to S4.

The measurement system 100 ends the process when the error in which the overlay mark is unable to be measured does not occur (No in S6). In the operation (measurement method) of the measurement system 100 illustrated in FIG. 4, a loop process of S6→S7→S4→S5→S6 may be repeated until the error in which the overlay mark is unable to be measured does not occur.

Figure 14:
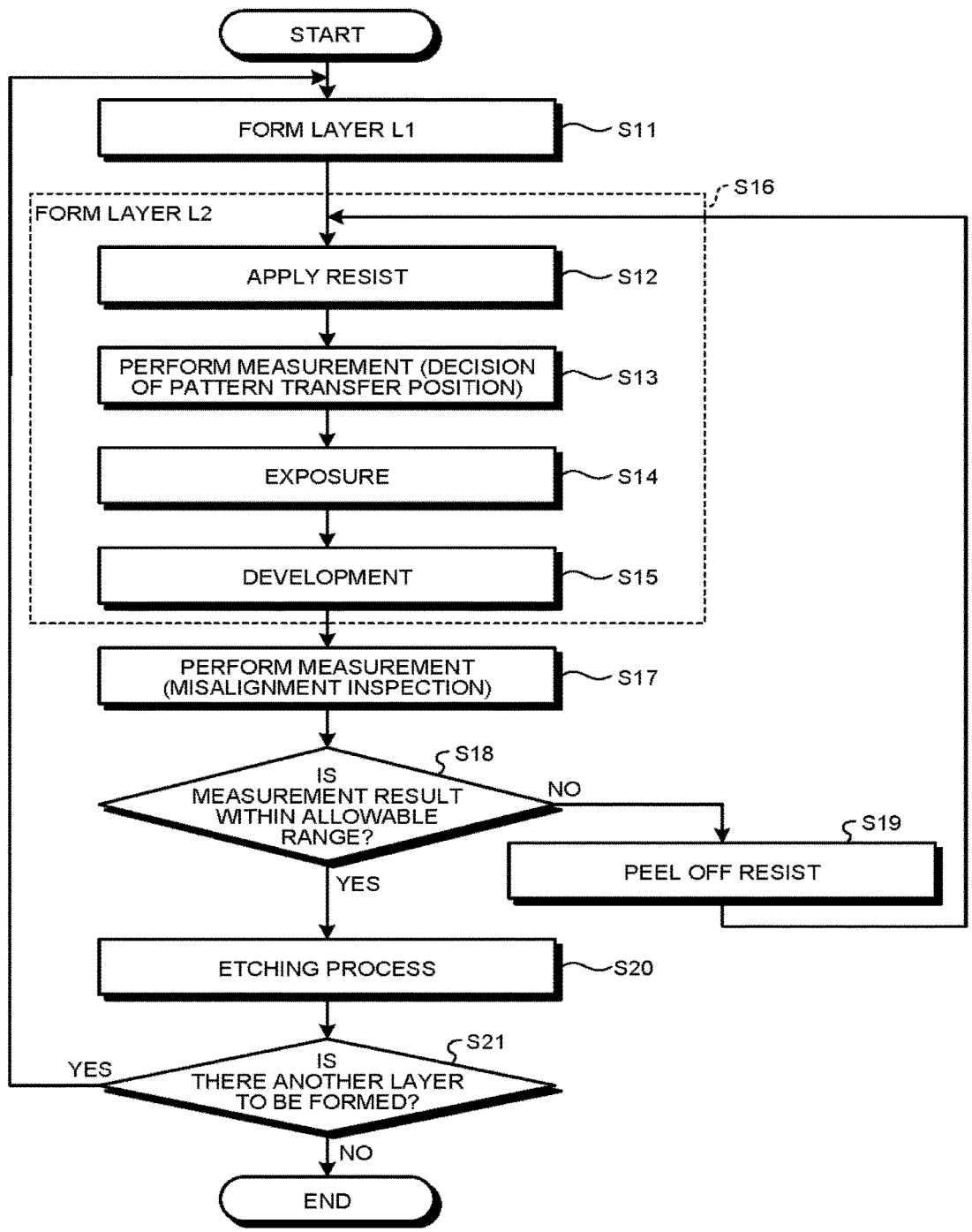
FIG. 14 is a flowchart illustrating a method manufacturing a semiconductor device according to an embodiment.

Next, a method of manufacturing a semiconductor device using the measurement system 100 will be described with reference to FIG. 14. FIG. 14 is a flowchart illustrating a method of manufacturing a semiconductor device.

The measurement system 100 forms a layer L1 on the substrate W (S11). Then, the measurement system 100 forms a layer L2 on the layer L1 (S16).

For example, the conveyance system 101 conveys the substrate W on which the layer L1 is formed to the coating apparatus 102. The coating apparatus 102 applies a resist on (above) the layer L1 (S12). The layer L2 onto which no pattern is transferred is formed on the layer L1. The conveyance system 101 conveys the substrate W on which the layers L1 and L2 are formed from the coating apparatus 102 to the heat sequence of process steps apparatus 104. The heat sequence of process steps apparatus 104 performs heat sequence of process steps (Lacking after applying) on the substrate W. The conveyance system 101 conveys the substrate W from the heat sequence of process steps apparatus 104 to the exposure apparatus 103. The measuring apparatus 103a of the exposure apparatus 103 performs measurement for deciding the pattern transfer position to the layer L2 on which no pattern is formed using the overlay mark MK1 of the layer L1 (S13).

Here, S13 is a process corresponding to S5 of FIG. 4 in the case of the transfer position decision, but it is preferable to perform the process corresponding to S1 to S4 of FIG. 4 before S13 starts.

The exposure apparatus 103 decides a position onto which the pattern is transferred in the layer L2 (resist film) in accordance with the measurement result of the measuring apparatus 103a, performs the exposure process for the pattern transfer, and forms a latent image on the layer L2 (resist film) (S14). The conveyance system 101 conveys the substrate W from the exposure apparatus 103 to the heat sequence of process steps apparatus 104. The heat sequence of process steps apparatus 104 performs heat sequence of process steps (baking after exposure) on the substrate W. The conveyance system 101 conveys the substrate W from the heat sequence of process steps apparatus 104 to the developing apparatus 105. The developing apparatus 105 performs a developing process and develops the latent image on the layer L2 (resist film) (S15).

The conveyance system 101 conveys the substrate W from the developing apparatus 105 to the misalignment inspecting apparatus 106. The measuring apparatus 106a of the misalignment inspecting apparatus 106 measures the misalignment amount between the layer L1 and the layer using the overlay mark MK1 of the layer L1 and the overlay mark MK2 of the layer L2 (S17).

Here, S17 is a process corresponding to S5 of FIG. 4 in the case of the misalignment inspection, but it is preferable to perform the process corresponding to S1 to S4 in FIG. 4 before S17 starts.

The measurement system 100 determines whether or not the measurement result (misalignment inspection result) of S17 is within an allowable range (S18). When the measurement result of S17 is not within the allowable range (No in S18), the measurement system 100 peels off the layer L2 (resist film) from the substrate W using a cleaning apparatus (not illustrated) (S19) and causes the process to return to S12.

When the measurement result of S17 is within the allowable range (Yes in S18), the measurement system 100 performs an etching process on a lower layer (for example, a layer (not illustrated) between the layer L1 and the layer L2) using the layer L2 (resist film) as a mask (S20).

The measurement system 100 determines whether or not there is another layer to be formed (S21). The measurement system 100 causes the process to return to S11 when there is another layer to be formed (Yes in S21). When there is no other layer to be formed (No in S21), the measurement system 100 ends the process.

As described above, in the embodiment, for measurement of the overlay mark, a plurality of shot regions on a substrate are classified into a plurality of groups corresponding to an attribute of a layer based on information of warping/deformation/step difference of the substrate or the like, and a measurement condition corresponding to an attribute is decided for each group. Accordingly, the occurrence of the error in which the overlay mark is unable to be measured is prevented. As a result, it is possible to prevent sequence of process steps for the substrate from being stopped, and it is possible to suppress a decrease in the throughput of the sequence of process steps for the substrate in the manufacturing of the semiconductor device.

It should be noted that the concept of the present embodiment can be applied to measurement of other marks (an alignment detection mark, a focus detection mark, or the like) in addition to the measurement of the overlay mark.

Alternatively, the technology of the present embodiment is applied when a measurement error occurs as well as when the error in which the overlay mark is unable to be measured occurs, and in this case, it is possible to reduce the measurement error and expect the improvement in the yield of the substrate. For example, in S6 of the measurement method illustrated in FIG. 4, the measurement system 100 may determine whether or not the measurement result falls within a predetermined allowable range instead of determining whether or not the error in which the overlay mark is unable to be measured by the measuring apparatus occurs. Accordingly, in the operation (measurement method) of the measurement system 100 illustrated in FIG. 4, the loop process of S6→S7→S4→S5→S6 may be repeated until the measurement result falls within the allowable range.

Figure 15:
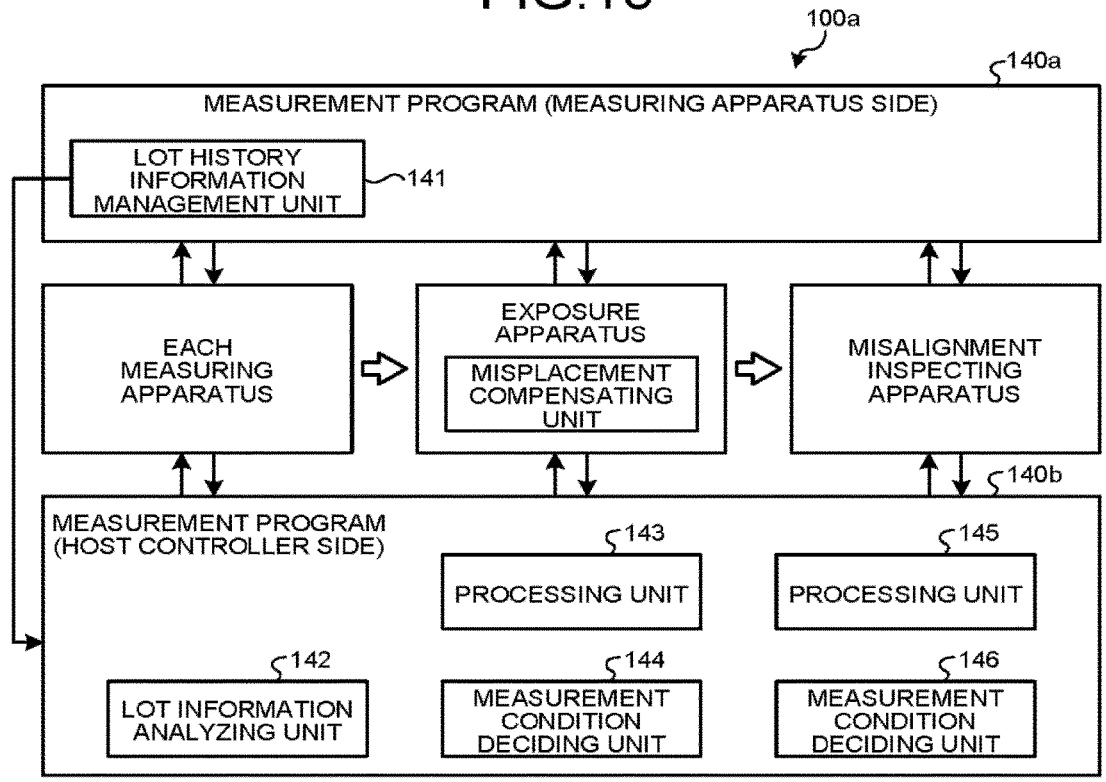
FIG. 15 is a diagram illustrating a configuration of a measurement program according to a modified example of an embodiment.

Alternatively, as illustrated in FIG. 15, in a measurement system 100a, each of measurement programs 140a and 140b may be configured such that some functions are installed in the measuring apparatus, and the remaining functions are installed in the host controller 109. FIG. 15 is a diagram illustrating a configuration of the measurement programs 140a and 140b in accordance with a modified example of the embodiment. For example, the measurement program 140a on the side of the measuring apparatuses 103a and 106a may include the lot history information management unit 141, and the measurement program 140b on the side of the host controller 109 may include the lot information analyzing unit 142, the processing unit 143, the measurement condition deciding unit 144, the processing unit 145, and the measurement condition deciding unit 146. At this time, the measurement program 140a and the measurement program 140b operate in cooperation with each other while exchanging data via a communication line and are able to implement an operation similar to that of the measurement program 140 according to the embodiment.

Figure 16:
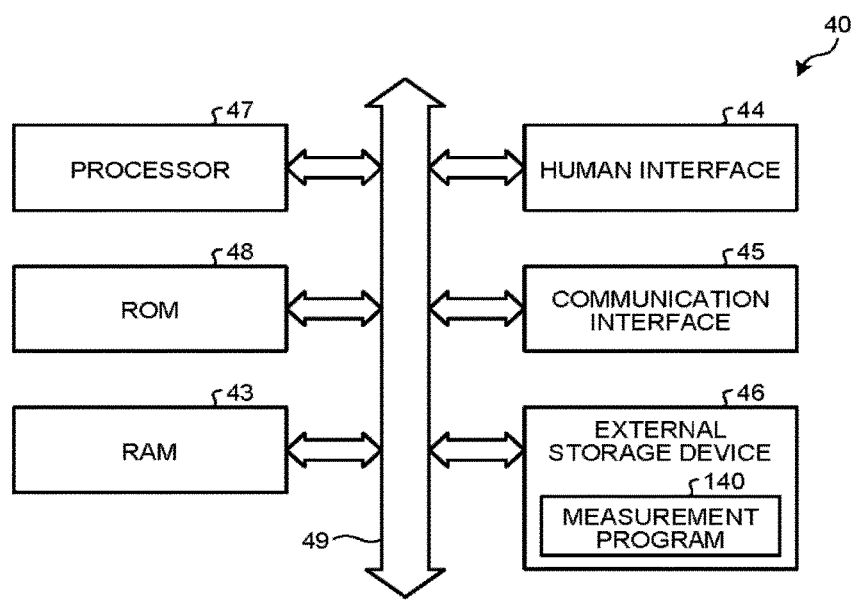
FIG. 16 is a diagram illustrating a configuration of hardware to which a measurement program according to another modified example of an embodiment is applied.

Alternatively, the measurement program 140 may be installed in a computer 40 as illustrated in FIG. 16, and the computer 40 may be connected to be able to perform communication with the host controller 109. Referring to FIG. 16, a processor 47 including a CPU or the like, a ROM 48 that stores fixed data, a RAM 43 that provides a work area to the processor 47, a human interface 44 that serves as an intermediary between a human and a computer, a communication interface 45 that provides a communication means with the outside, and an external storage device 46 that stores a program and various kinds of data for operating the processor 47 may be provided, and the processor 47, the ROM 48, the RAM 43, the human interface 44, the communication interface 45, and the external storage device 46 are connected to one another via a bus 49.

Examples of the external storage device 46 include a magnetic disk such as a hard disk, an optical disk such as a DVD, and a portable semiconductor memory device such as a USB memory or a memory card. Examples of the human interface 44 include a keyboard, a mouse, and a touch panel as an input interface and include a display and a printer as an output interface. Examples of the communication interface 45 include a LAN card, a modem, and a router for establishing a connection with the Internet, a LAN, or the like. Here, the measurement program 140 is installed in the external storage device 46. Further, when the measurement program 140 is executed by the processor 47, the functional components illustrated in FIG. 2 (the lot history information management unit 141, the lot information analyzing unit 142, the processing unit. 143, the measurement condition deciding unit 144, the processing unit 145, and the measurement condition deciding unit 146) are developed onto the RAM 43 and executed collectively when the measurement program 140 is activated or executed sequentially as the measurement program 140 performs the process.

It should be noted that the measurement program 140 to be executed by the processor 47 may be stored in the external storage device 45 and read onto the RAM 43 when the measurement program 140 is executed, or the measurement program 140 may be stored in the ROM 48 in advance or may be acquired via the communication interface 45. Further, the measurement program 140 may be executed by a stand-alone computer or may be executed by a cloud computer.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A measurement method comprising:
   acquiring layer information related to a plurality of layers to be superimposed for each of a plurality of shot regions on a substrate;
   classifying the plurality of shot regions into a plurality of groups corresponding to a layer attribute based on the acquired layer information; and
   deciding a measurement condition of a measuring apparatus for each of the plurality of groups, the measurement condition being a condition to be used, when a first layer and a second layer are sequentially stacked on the substrate to manufacture a semiconductor device, in order to decide a pattern transfer position to the second layer according to a position of the first layer or in order to inspect a misalignment between the first layer and the second layer.

2. The measurement method according to claim 1, further comprising:
   performing a respective measurement through the measuring apparatus for each of the plurality of groups in accordance with the decided measurement condition; and
   changing the decided measurement condition in accordance with a result of the measurement for each of the plurality of groups.

3. The measurement method according to claim 2, wherein the changing of the measurement condition includes changing the decided measurement condition when an error in which the measuring apparatus is unable to perform the measurement occurs for each of the plurality of groups.

4. The measurement method according to claim 2, wherein the changing of the measurement condition includes changing the decided measurement condition when a measurement result of the measuring apparatus does not fall within a predetermined allowable range for each of the plurality of groups.

5. The measurement method according to claim 1, wherein the acquiring of the layer information includes
measuring at least one of a warping shape of the substrate, a surface step difference of the substrate, and/or a thickness of a film formed on the substrate, and
obtaining the layer information including at least one of a layer height, a layer film thickness, and/or a layer structure in accordance with a result of the measurement.

6. The measurement method according to claim 1, wherein
the measuring apparatus is a warping measuring apparatus that measures a warping amount distribution on a surface of the substrate, and
the acquiring of the layer information includes
measuring a warping shape of the substrate through the warping measuring apparatus, and
obtaining the layer information including a layer height in accordance with a result of measurement performed by the warping measuring apparatus.

7. The measurement method according to claim 1, wherein
the measuring apparatus is a step difference measuring apparatus that measures a step difference on a surface of the substrate, and
the acquiring of the layer information includes
measuring a surface step difference of the substrate through the step difference measuring apparatus, and
obtaining the layer information including a layer structure in accordance with a result of measurement performed by the step difference measuring apparatus.

8. The measurement method according to claim 1, wherein
the measuring apparatus is a film thickness measuring apparatus that measures a film thickness of a layer stacked on the substrate,
the acquiring of the layer information includes
measuring a thickness of a film formed on the substrate through the film thickness measuring apparatus, and
obtaining the layer information including a layer film thickness in accordance with a result of a measurement performed by the film thickness measuring apparatus.

9. The measurement method according to claim 1, wherein the measurement condition includes at least one of a focus position of an optical microscope used for a measurement, a wavelength of light used for imaging of the optical microscope, and/or information designating a template image to be used for the measurement among a plurality of template images.

10. The measurement method according to claim 1, wherein
the measuring apparatus includes a stage on which the substrate is placed,
the measurement condition includes a focus position of an optical microscope used for a measurement, and
the performing of the measurement through the measuring apparatus includes
controlling a height position of the stage in accordance with a focus position included in the measurement condition, and
performing measurement through the measuring apparatus in a state in which the height position of the stage is controlled.

11. The measurement method according to claim 1, wherein the measuring apparatus includes
a stage on which the substrate is placed, and
a wavelength filter that is able to insert a selected filter among a plurality of filters corresponding to different wavelengths into a light path from a light source to the stage,
the measurement condition includes a wavelength of light used for imaging of an optical microscope, and
the performing of the measurement through the measuring apparatus includes
controlling which of the plurality of filters of the wavelength filter is inserted in the light path in accordance with a wavelength of light included in the measurement condition, and
performing the measurement through the measuring apparatus in a state in which the wavelength filter is controlled.

12. The measurement method according to claim 1, wherein
the measuring apparatus includes
a stage on which the substrate is placed,
an imaging element that images a mark on the substrate,
an image processor that performs image processing on a captured image captured by the imaging element, and
an operation processor that performs template matching and performs image recognition on overlay marks in the captured image,
the measurement condition includes information designating a template image of an overlay mark used for a measurement among a plurality of template images of the overlay marks, and
the performing of the measurement through the measuring apparatus includes
imaging the overlay mark on the substrate, and
selecting the template image of the overlay mark in accordance with the information designating the template image included in the measurement condition and performing template matching of an image of the imaged overlay mark and the selected template image.

13. A method of manufacturing a semiconductor device, the method comprising:
forming a first layer including an overlay mark on a substrate;
coating the substrate on which the first layer is formed with a resist to be formed as a second layer;
measuring the overlay mark with a first measurement condition obtained by:
acquiring layer information related to the first layer and the second layer for each of a plurality of shot regions on the substrate;
classifying the plurality of shot regions into a plurality of groups corresponding to a layer attribute based on the acquired layer information; and
deciding the first measurement condition of a first measuring apparatus for each of the plurality of groups;
deciding a transfer position of a pattern with a second measurement condition obtained by deciding the second measurement condition of a second measuring apparatus for each of the plurality of groups; and
performing an exposure process for pattern transfer and forming a latent image on the resist on the substrate.

14. The method of manufacturing the semiconductor device according to claim 13, further comprising:
developing the formed latent image to form the second layer; and measuring a first overlay mark and a second overlay mark in accordance with the first measurement condition and obtaining a misalignment amount between the first layer and the second layer.

15. A semiconductor manufacturing system that manufactures a semiconductor device by sequentially stacking a plurality of layers on a substrate, the semiconductor manufacturing system comprising:
   an apparatus including a measuring apparatus that measures the substrate;
   acquiring circuitry that acquires layer information related to a plurality of layers to be superimposed for each of a plurality of shot regions on the substrate;
   processing circuitry that classifies the plurality of shot regions into a plurality of groups corresponding to a layer attribute based on the acquired layer information; and
   deciding circuitry that decides a measurement condition of a measuring apparatus for each of the plurality of groups, the measurement condition being a condition to be used, when a first layer and a second layer are sequentially stacked on the substrate to manufacture the semiconductor device, in order to decide a pattern transfer position to the second layer according to a position of the first layer or in order to inspect a misalignment between the first layer and the second layer.

16. The semiconductor manufacturing system according to claim 15, wherein
   the apparatus is an exposure apparatus, and
   the measuring apparatus performs measurement for deciding the pattern transfer position to the second layer on which no pattern is formed.

17. The semiconductor manufacturing system according to claim 15, wherein
   the apparatus is a misalignment inspecting apparatus, and
   the measuring apparatus performs measurement for inspecting whether or not the first layer and the second layer on which a pattern is formed are properly superimposed.

* * * * *